(12) United States Patent
Yamano

(10) Patent No.: US 9,146,642 B2
(45) Date of Patent: Sep. 29, 2015

(54) SENSOR DEVICE AND INFORMATION PROCESSING DEVICE

(75) Inventor: Ikuo Yamano, Tokyo (JP)

(73) Assignee: Sony Corporation, Tokyo (JP)

( * ) Notice: Subject to any disclaimer, the term of this patent is extended or adjusted under 35 U.S.C. 154(b) by 461 days.

(21) Appl. No.: 12/847,122

(22) Filed: Jul. 30, 2010

(65) Prior Publication Data

US 2011/0057904 A1   Mar. 10, 2011

(30) Foreign Application Priority Data

Sep. 7, 2009   (JP) ................ P2009-206464

(51) Int. Cl.
*G06F 3/044* (2006.01)
*G06F 3/041* (2006.01)
*H01G 5/16* (2006.01)

(52) U.S. Cl.
CPC .............. *G06F 3/044* (2013.01); *G06F 3/0414* (2013.01); *H01G 5/16* (2013.01); *G06F 2203/04105* (2013.01); *G06F 2203/04107* (2013.01); *H03K 2217/960765* (2013.01)

(58) Field of Classification Search
CPC ................. G06F 3/041–3/047; G06F 2203/04101–2203/04113
USPC ............ 345/173–178, 104; 178/18.01–18.09, 178/18.11
See application file for complete search history.

(56) References Cited

U.S. PATENT DOCUMENTS

| | | | | |
|---|---|---|---|---|
| 6,002,389 | A  * | 12/1999 | Kasser .......................... | 345/173 |
| 6,927,761 | B2 * | 8/2005 | Badaye et al. ................ | 345/173 |
| 6,943,705 | B1 * | 9/2005 | Bolender et al. ................ | 341/33 |
| 7,595,790 | B2 | 9/2009 | Yamamoto et al. | |
| 8,049,735 | B2 * | 11/2011 | Lee et al. ...................... | 345/173 |
| 2004/0227736 | A1 * | 11/2004 | Kamrath et al. ............... | 345/173 |
| 2006/0197753 | A1 * | 9/2006 | Hotelling ...................... | 345/173 |
| 2008/0238881 | A1 * | 10/2008 | Perski et al. .................. | 345/173 |
| 2010/0026655 | A1 * | 2/2010 | Harley .......................... | 345/174 |
| 2010/0253651 | A1 * | 10/2010 | Day .............................. | 345/175 |

FOREIGN PATENT DOCUMENTS

JP   2006-236988   9/2006
WO   WO 2009123388 A1 *   10/2009

* cited by examiner

*Primary Examiner* — Stephen Sherman
(74) *Attorney, Agent, or Firm* — Paratus Law Group, PLLC

(57) ABSTRACT

A sensor device is provided which includes a pressure-sensitive sensor which changes shape in response to pressing of an operation tool and which detects change in capacitance due to the change in shape, and a barrier which covers at least a part of the pressure-sensitive sensor and which prevents change in capacitance of the pressure-sensitive sensor due to capacitive coupling that occurs with approach between the pressure-sensitive sensor and the operation tool.

23 Claims, 9 Drawing Sheets

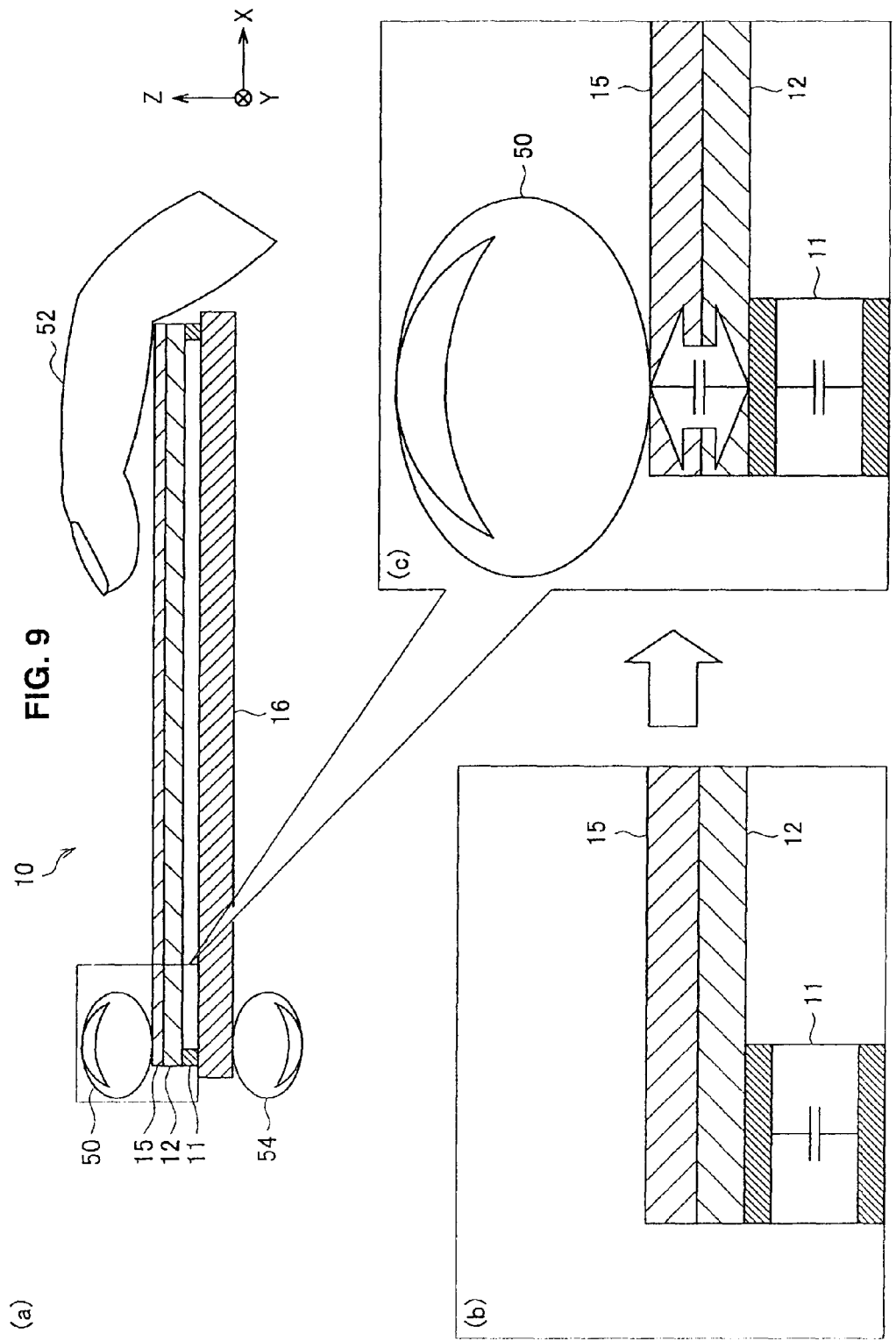

SENSOR DEVICE AND INFORMATION PROCESSING DEVICE

BACKGROUND OF THE INVENTION

1. Field of the Invention

The present invention relates to a sensor device and an information processing device.

2. Description of the Related Art

In recent years, a variety of information processing devices such as mobile phones and car navigation systems each of which includes a sensor device including a touch panel have been distributed in the market. For operation of the touch panel, a variety of methods such as a resistive method, an electromagnetic method, and a capacitive method are adopted. According to such technology, by the contact of an operation tool such as a finger or a touch pen on the touch panel, the position of the operation tool can be detected.

Since the touch panel described above is for detecting the position of an operation tool, the pressure on the touch panel is difficult to be determined, which thus limits realizable operation. On the other hand, there have been also developed information processing devices each of which is provided with a pressure-sensitive sensor for changing the capacitance according to pressure on a touch panel. According to the device, change in the pressure exerted on the touch panel by a user is detected as change in the capacitance of the pressure-sensitive sensor, and thereby a variety of operation according to the change in pressure (pressing force) in addition to the position can be realized.

SUMMARY OF THE INVENTION

However, in the pressure-sensitive sensor described above, the capacitance to be detected may change based on capacitive coupling between the pressure-sensitive sensor and the operation tool even by the approach of an operation tool such as a finger of the user. At this time, since the pressing pressure on the touch panel does not change, the change in the capacitance value is false detection, so that the pressure-sensitive sensor outputs a false pressure value. As a result, in the case of detecting input operation by a user's finger or the like and performing processing according thereto by using the touch panel and the pressure-sensitive sensor, there was a threat that malfunction of the information processing device would occur due to the false detection by the pressure-sensitive sensor.

In light of the foregoing, it is desirable to provide a sensor device and an information processing device which are novel and improved, and which are capable of preventing change in the capacitance of the sensor device due to capacitive coupling with an operation tool that occurs with approach of the operation tool such as a finger.

According to an embodiment of the present invention, there is provided a sensor device including a pressure-sensitive sensor which changes shape in response to pressing of an operation tool and which detects change in capacitance due to the change in shape, and a barrier which covers at least a part of the pressure-sensitive sensor and which prevents change in capacitance of the pressure-sensitive sensor due to capacitive coupling that occurs with approach between the pressure-sensitive sensor and the operation tool.

According to the sensor device, the barrier may be an electric conductor connected to a ground, and the electric conductor may prevent the change in the capacitance of the pressure-sensitive sensor due to the capacitive coupling between the operation tool and the pressure-sensitive sensor.

According to the sensor device, there may be further included a touch panel which includes an input operation surface and which detects a pressing position of the operation tool on the input operation surface. The pressure-sensitive sensor may change form according to the pressing position on the input operation surface of the touch panel, and the pressure-sensitive sensor may detect the change in the capacitance due to the change in shape while preventing false detection of the pressure-sensitive sensor due to the operation tool near the pressure-sensitive sensor by using the barrier.

According to the sensor device, the barrier may cover the pressure-sensitive sensor from the input operation surface side and from a surface side perpendicular to the input operation surface.

According to the sensor device, the barrier may include a first barrier which covers the pressure-sensitive sensor from the input operation surface side and a second barrier which covers the pressure-sensitive sensor from the surface side perpendicular to the input operation surface, the first barrier and the second barrier may be physically separated, and the first barrier may be movable according to the change in form.

According to the sensor device, the first barrier may be a thin film.

According to the sensor device, the second barrier may cover, among surfaces of the pressure-sensitive sensor, a surface on the opposite side of the touch panel side.

According to the sensor device, the second barrier may be formed with a distal end higher than a position of the input operation surface.

According to the sensor device, the pressure-sensitive sensor may include a first elastic body, and the barrier may include a second elastic body which changes form with the first elastic body while being integrated with the first elastic body, according to the pressing of the operation tool.

According to another embodiment of the present invention, there is provided an information processing device including a pressure-sensitive sensor which changes shape in response to pressing of an operation tool and which detects change in capacitance due to the change in shape, a barrier which covers at least a part of the pressure-sensitive sensor and which prevents change in capacitance of the pressure-sensitive sensor due to capacitive coupling that occurs with approach between the pressure-sensitive sensor and the operation tool, and a controller which processes information according to operation of the operation tool based on the change in the capacitance detected by the pressure-sensitive sensor.

According to the embodiments of the present invention described above, it is possible to prevent the change in the capacitance of the sensor device due to the capacitive coupling with the operation tool that occurs with the approach of the operation tool such as a finger.

BRIEF DESCRIPTION OF THE DRAWINGS

FIG. 9 are sectional views of the sensor device according to the related art to which fingers are in proximity.

DETAILED DESCRIPTION OF THE EMBODIMENT

Figure 1:
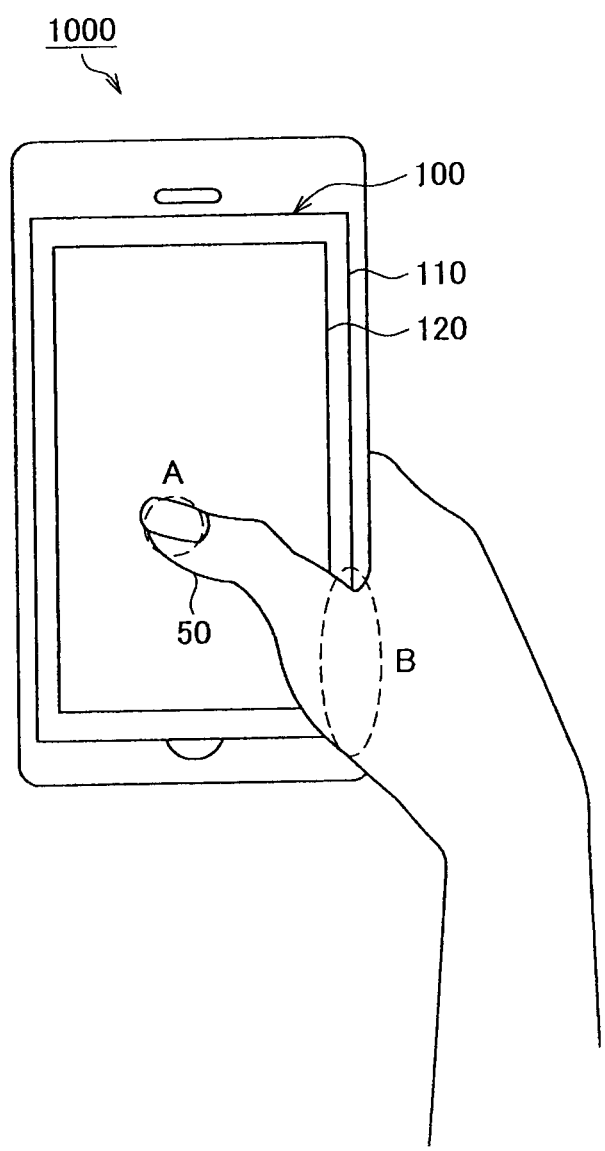
FIG. 1 is a diagram for explaining a mobile device provided with a sensor device according to each of embodiments of the present invention.

Hereinafter, preferred embodiments of the present invention will be described in detail with reference to the appended drawings. Note that, in this specification and the appended drawings, structural elements that have substantially the same function and structure are denoted with the same reference numerals, and repeated explanation of these structural elements is omitted.

In addition, description will be made in the following order.
1. About sensor device according to a related art
2. About information processing device to which sensor device according to each of embodiments of the present invention is applied
3. First embodiment
4. Second embodiment
5. Third embodiment <1. About sensor device according to a related art>

Figure 8:
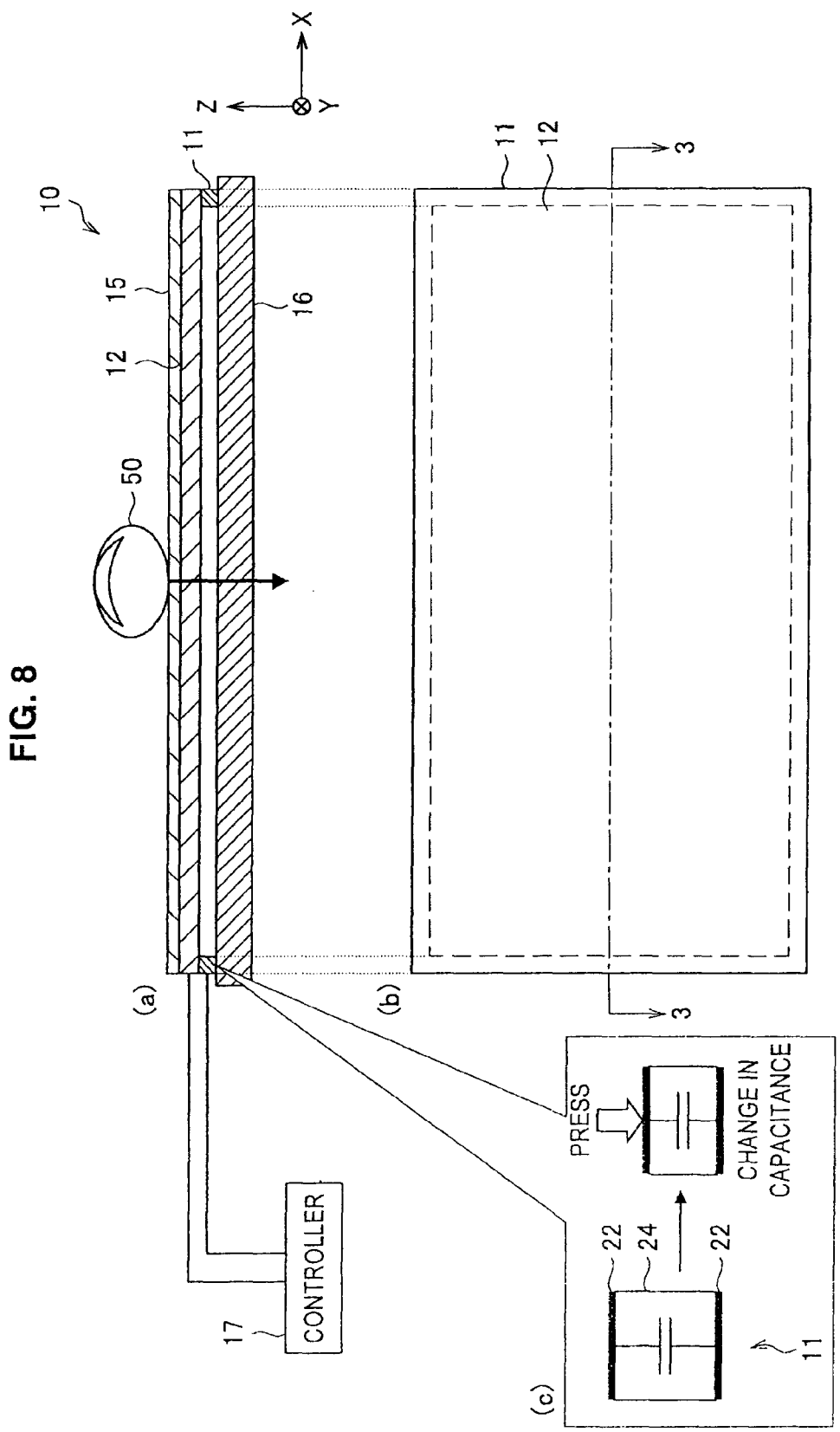
FIG. 8 are a sectional view and a plan view for explaining a sensor device according to a related art.

First, an issue of a sensor device 10 according to a related art will be described with reference to FIG. 8 and FIG. 9. FIG. 8 are a sectional view and a plan view of the sensor device 10 according to the related art. FIG. 9 are sectional views of the sensor device 10 according to the related art to which fingers 50, 52, and 54 are in proximity.

Here, an X direction shown in FIG. 8 and FIG. 9 refers to a direction perpendicular to the thickness direction in which a pressure-sensitive sensor 11, a touch panel 12, and a top plate 15 are stacked on a base member 16. Moreover, a Y direction shown in FIG. 8 and FIG. 9 refers to a direction perpendicular to the thickness direction in which the pressure-sensitive sensor 11, the touch panel 12, and the top plate 15 are stacked on the base member 16 and orthogonal to the X direction. Moreover, a Z direction shown in FIG. 8 and FIG. 9 refers to a direction perpendicular to X-Y plane. Note that an X direction, a Y direction, and a Z direction in FIG. 2 to FIG. 7 described below are the same as the X direction, the Y direction, and the Z direction shown in FIG. 8 and FIG. 9.

Moreover, although an operation tool such as a finger or a stylus and a metal object can be given as examples of objects which cause capacitive coupling with a pressure-sensitive sensor, the description in the following will be made mainly taking the fingers 50, 52, and 54 as examples.

First, a configuration of the sensor device 10 will be described with reference to FIG. 8. FIG. 8 (a) is a sectional view showing a cross-section of the sensor device 10 taken along the cross-section line 3-3 in FIG. 8 (b). Moreover, FIG. 8 (b) is a plan view of the surface of the sensor device 10 seen from the positive Z-axis direction. Moreover, FIG. 8 (c) is an enlarged sectional view of the pressure-sensitive sensor 11 in FIG. 8 (a). As shown in FIG. 8 (a), the sensor device 10 includes the base member 16, the pressure-sensitive sensor 11, the capacitive touch panel 12, and the top plate 15.

The pressure-sensitive sensor 11 is arranged on the base member 16. As shown in FIG. 8 (b), the pressure-sensitive sensor 11 is formed with a substantially rectangular frame. Moreover, as shown in FIG. 8 (c), the pressure-sensitive sensor 11 includes two electrodes 22 and an elastic body 24. The elastic body 24 is sandwiched between the two electrodes 22 aligned in the Z direction. The elastic body 24 contracts by the pressure of an operation tool such as the finger 50 in the negative direction of the Z-axis. The pressure-sensitive sensor 11 detects change in capacitance caused by the elastic body 24 contracting and the distance between the two electrodes 22 being changed, as change in electric current or voltage. Examples of the elastic body 24 include a rubber elastic body and a sponge. Examples of rubber materials include a urethane rubber and a silicone rubber.

The touch panel 12 is formed immediately above the pressure-sensitive sensor 11. The touch panel 12 is a capacitive type with the surface which the finger 50 contacts served as an input operation surface, and the touch panel 12 detects change in the capacitance of an electrode formed on the input operation surface by contact of the finger 50 on the input operation surface, thereby detecting a position of the finger 50 in the XY direction. Moreover, in the Y direction, a display panel (not shown) is formed between the touch panel 12 and the base member 16. A user brings the finger 50 in contact with a predetermined position on the XY surface according to the content displayed on the display panel. The touch panel 12 includes, for example, a polyimide substrate, a PET film substrate, or a glass substrate.

The top plate 15 is formed on the touch panel 12. The top plate 15 plays a function of protecting the touch panel 12 and prevents occurrence of scratch on the touch panel 12. The finger 50 presses the touch panel 12 via the top plate 15. The top plate 15 includes a glass substrate or a resin substrate, for example.

The controller 17 is connected to the pressure-sensitive sensor 11 and the touch panel 12. The controller 17 controls a predetermined input operation of a mobile device provided with the sensor device 10, according to the detection values of the pressure-sensitive sensor 11 and the touch panel 12. The controller 17 calculates the pressure of the operation tool based on the capacitance detected by the pressure-sensitive sensor 11.

However, when the finger 50 presses the touch panel 12, change in the capacitance of the pressure-sensitive sensor 11 is also caused by the proximity of the finger 50. This point will be described with reference to FIG. 9. FIG. 9 (a) shows the sensor device 10 with the fingers 50, 52, and 54 in proximity thereto. FIG. 9 (b) shows the sensor 10 with the fingers 50, 52, and 54 not yet in proximity thereto. FIG. 9 (c) is an enlarged sectional view of the sensor device 10 with the finger 50 in proximity thereto.

Change in the capacitance of the pressure-sensitive sensor 11 is caused by the finger 50 approaching the sensor device 10. This is because the proximity of the finger 50 to the sensor device 10 causes capacitive coupling between the finger 50 and the sensor device 10 (electrode of the pressure-sensitive sensor 11), which makes a difference to the capacitance of the pressure-sensitive sensor 11. The cause of the change in the capacitance of the pressure-sensitive sensor 11 is not limited to the proximity of the finger from the above. For example, as shown in FIG. 9 (a), the capacitance of the pressure-sensitive sensor 11 changes also in the case where the finger 52 approaches from the side of the sensor device 10 or in the case where the finger 54 approaches from below the sensor device 10.

Then, the pressure-sensitive sensor 11 may falsely detect change in the capacitance which does not reflect the pressure desired to be detected. Consequently, in the following, there will be described a sensor device according to the present embodiment which prevents change in capacitance caused by proximity of a finger in order to detect change in the capacitance with high accuracy.

<2. About information processing device to which sensor device according to each of embodiments of the present invention is applied>

Next, an information processing device provided with a sensor device according to each embodiment of the present invention will be described taking a mobile phone 1000 as an example, with reference to FIG. 1. FIG. 1 is a diagram for explaining the mobile phone 1000 provided with the sensor device according to the embodiments.

The mobile phone 1000 shown in FIG. 1 is formed by using a sensor device 100 (which may be a sensor device 200 or a sensor device 300; the same applies to descriptions made with reference to FIG. 1, hereinafter). The sensor device 100 mainly includes a pressure-sensitive sensor 110 and a touch panel 120.

A user brings a finger 50 into contact with the touch panel 120 and presses the touch panel 120 with the finger, thereby performing input operation to the mobile phone 1000. As described above, in the mobile phone 1000, a position of the finger 50 is detected by the touch panel 120. Furthermore, in the mobile phone 1000, the pressure-sensitive sensor 110 detects change in capacitance based on change in the distance between two electrodes caused by contraction of an elastic body sandwiched by the two electrodes, as a pressure of the finger 50. In this manner, input operation is controlled in the mobile phone 1000 according to the contact position of the finger 50 on the touch panel 120 and the pressure of the finger 50.

Moreover, although in the present embodiment the mobile phone 1000 is given as an example of the information processing device provided with the sensor device 100, use of the sensor device 100 is not particularly limited, and the sensor device 100 can be applied to a variety of devices such as portable communication devices including PHS (Personal Handyphone System) cellular phones, portable video/music players, portable game players, and computers including PDAs (Personal Digital Assistants) and notebook PCs. Note that there may be a case where the sensor device 100 is not provided with the touch panel 120.

<3. First Embodiment>

Figure 2:
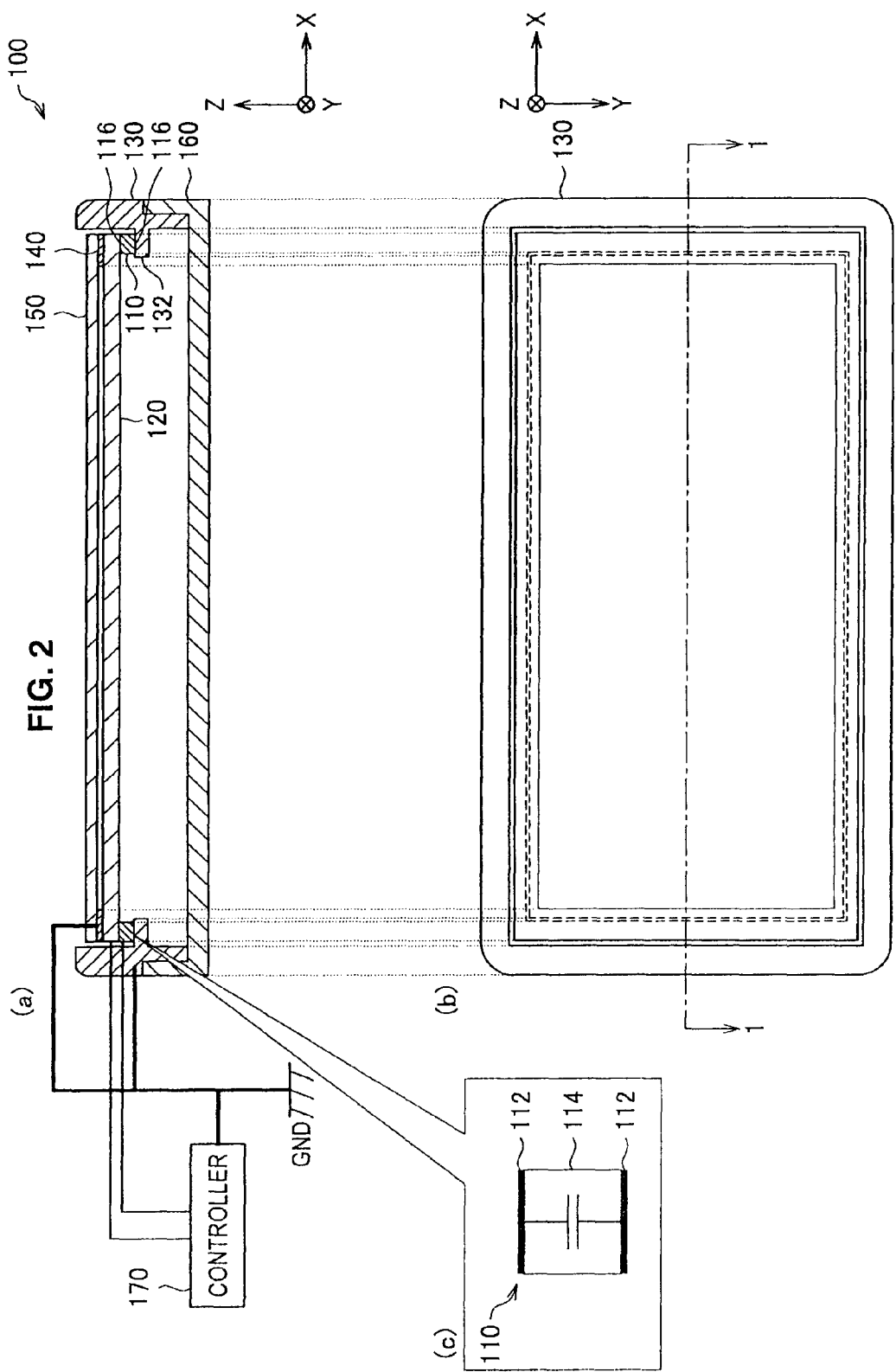
FIG. 2 are a sectional view and a plan view for explaining a sensor device according to a first embodiment of the present invention.
Figure 3:
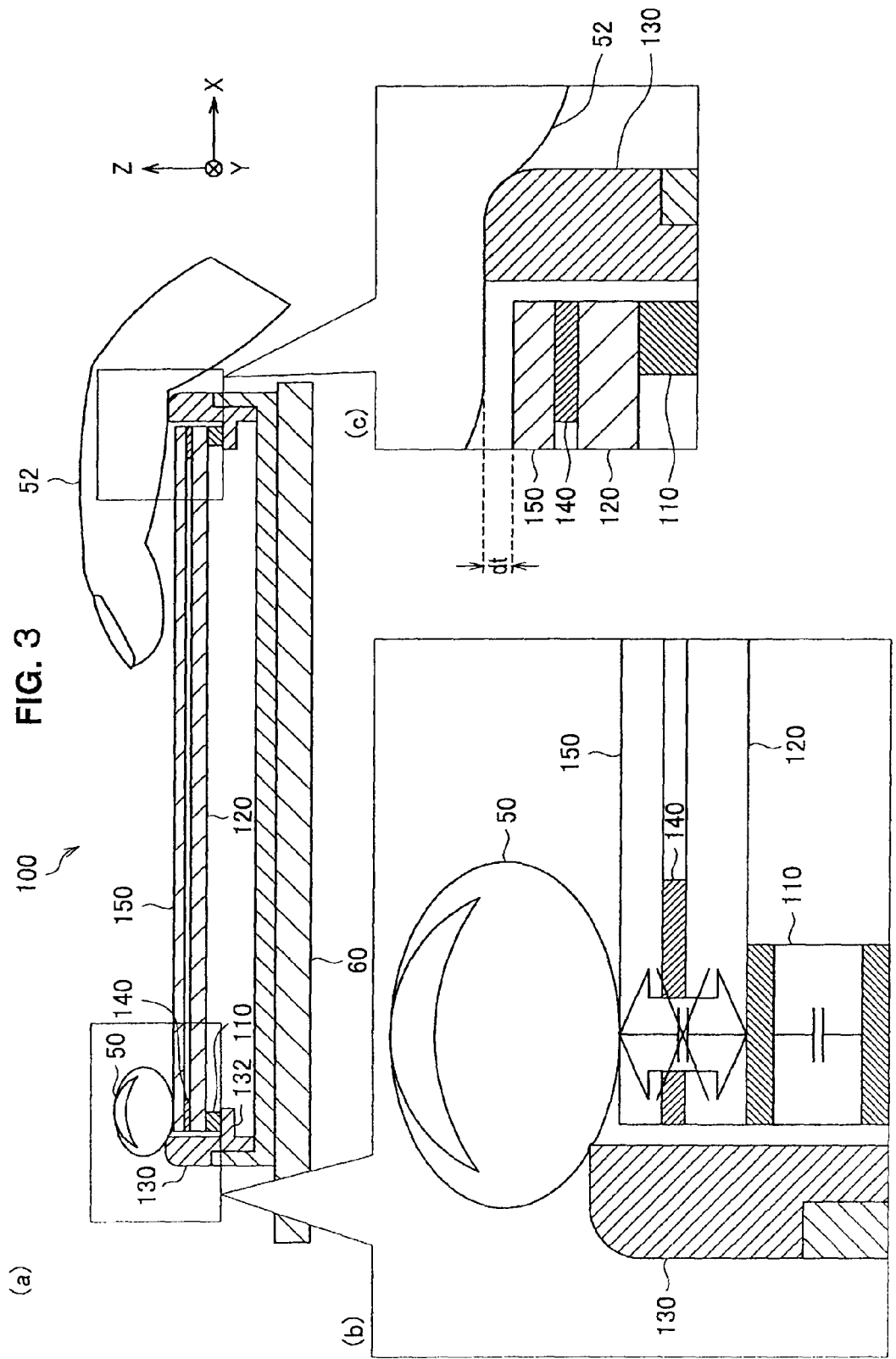
FIG. 3 are sectional views of the sensor device according to the embodiment to which fingers are in proximity.

Subsequently, a sensor device according to a first embodiment of the present invention will be described in detail with reference to FIG. 2 to FIG. 3. FIG. 2 are a sectional view and a plan view for explaining the sensor device according to the first embodiment of the present invention. FIG. 3 are sectional views of the sensor device according to the embodiment to which fingers are in proximity. The sensor device is provided to a mobile device, for example.

First, a configuration of the sensor device 100 will be described with reference to FIG. 2. FIG. 2 (a) is a sectional view showing a cross-section of the sensor device 100 taken along the cross-section line 1-1 in FIG. 2 (b). Moreover, FIG. 2 (b) is a plan view of the surface of the sensor device 100 seen from the positive Z-axis direction. Moreover, FIG. 2 (c) is an enlarged sectional view of the pressure-sensitive sensor 110 in FIG. 2 (a). As shown in FIG. 2 (a), the sensor device 100 includes a base member 160, a pressure-sensitive sensor 110, a capacitive touch panel 120, a top plate 150, a conductive housing 130, and a conductive evaporated film 140. As shown in FIG. 2 (c), the pressure-sensitive sensor 110 includes two electrodes 112 and an elastic body 114.

As shown in FIG. 2 (a), the sensor device 100 is installed on the base member 160. A mobile phone 1000 provided with the sensor device 100 is often placed on a table 60 in FIG. 3 or the like. The base member 160 is formed of a resin substrate, for example.

The conductive housing 130 is formed of a conductive material and is formed of a barrier and the like. The conductive housing 130 is a metal housing having a groove running through the center adapted to fit the external shape of the touch panel 120. The conductive housing 130 is fitted into the base member 160. The conductive housing 130 prevents occurrence of capacitive coupling between a finger approaching from the side of the sensor device 100 and the pressure-sensitive sensor 110. Projection 132 is formed on the conductive housing 130. The projection 132 protrudes from the XY surface and plays a role of supporting the pressure-sensitive sensor 110, the touch panel 120, the conductive evaporated film 140, and the top plate 150. Moreover, the projection 132 prevents occurrence of capacitive coupling between a finger and the pressure-sensitive sensor 110 against the finger's approach to the sensor device 100 from the negative direction of the Z axis (from the bottom side).

The conductive housing 130 is connected to a ground in order to prevent occurrence of capacitive coupling between a finger and the pressure-sensitive sensor 110. It is only necessary for the conductive housing 130 to be a conductive material, which contains as the main component aluminum, conductive rubber, or conductive carbon, for example.

A thin film metal surface is formed on the bottom surface of the top plate 150 by evaporation. Moreover, as shown in FIG. 2 (b), by making the conductive evaporated film 140 in the form of a frame, the top surface of the pressure-sensitive sensor 110 is covered by the conductive evaporated film 140. Moreover, the conductive evaporated film 140 does not exist anywhere other than the outer edge of the touch panel 120, which thus does not affect position detection of the touch panel 120.

The conductive evaporated film 140 is formed of a conductive material and is an example of the barrier. The conductive evaporated film 140 is formed on the pressure-sensitive sensor 110 as shown in FIG. 2 (a), and the pressure-sensitive sensor 110, the touch panel 120, and the conductive evaporated film 140 are formed in that order. Moreover, although not shown, the pressure-sensitive sensor 110, the conductive evaporated film 140, and the touch panel 120 may be formed in that order. In the present embodiment, the conductive evaporated film 140 is not physically attached to the conductive housing 130. This enables the conductive evaporated film 140 to move up and down with the top plate 150 and the touch panel 120. Consequently, by a finger 50 pressing the touch panel 120, the pressure-sensitive sensor 110 contracts.

In the same manner as the conductive housing 130, the conductive evaporated film 140 is connected to the ground in order to prevent occurrence of capacitive coupling between the pressure-sensitive sensor 110 and the finger 50. Moreover, in the same manner as the conductive housing 130, the conductive evaporated film 140 contains as the main component aluminum, conductive rubber, or conductive carbon, for example. The conductive evaporated film 140 may include as the main component the same material as the conductive housing 130 or may include as the main component a different material from the conductive housing 130.

As shown in FIG. 2 (b), the pressure-sensitive sensor 110 is a substantially-rectangular frame. The elastic body 114 changes shape (contracts) by pressure exerted on the top plate 150 (the touch panel 120) due to finger's pressing. The distance between the two electrodes 112 is changed by the elastic body 114 shown in FIG. 2 (c) contracting, and thereby the capacitance between the electrodes changes. The capacitance of the pressure-sensitive sensor 110 is transmitted to a controller 170. Examples of the elastic body 114 include a rubber elastic body and a sponge. Examples of rubber materials include a urethane rubber and a silicone rubber.

An insulator 116 is formed on the surface of the electrode. An example of the insulator 116 is double-sided tape.

The touch panel 120 is formed immediately above the pressure-sensitive sensor 110. The touch panel 120 is a capacitive type including an input operation surface on the surface which the finger contacts. The input operation surface detects the contact position of the finger on the XY surface. Moreover, in the Y direction, a display panel (not shown) is formed between the touch panel 120 and the base member 160. A user causes the finger to contact and press a predetermined position of the touch panel 120 according to the content displayed on the display panel. The touch panel 120 includes, for example, a polyimide substrate, a PET film substrate, or a glass substrate.

The top plate 150 is formed on the touch panel 120. The top plate 150 plays a function of protecting the touch panel 120 and prevents occurrence of scratch on the touch panel 120. The finger presses the touch panel 120 via the top plate 150. The top plate 150 includes a glass substrate or a resin substrate, for example.

The controller 170 is connected to the pressure-sensitive sensor 110 and the touch panel 120. The controller 170 calculates the value of the pressure of the finger's pressing from the change amount of the capacitance detected by the pressure-sensitive sensor 110 and calculates the contact position from the change amount of the capacitance detected by the touch panel 120.

Next, a state where a finger is in proximity to the sensor device 100 will be described with reference to FIG. 3. When a finger 50 approaches the sensor device 100 from the input operation surface side, capacitive coupling is about to occur between the finger 50 and the pressure-sensitive sensor 110 as shown in the enlarged view of FIG. 3 (b). In the sensor device 100 according to the present embodiment, there is the conductive evaporated film 140 between the finger 50 and the pressure-sensitive sensor 110, and the conductive evaporated film 140 is connected to the ground, as describe above. Consequently, the conductive evaporated film 140 prevents occurrence of capacitive coupling between the pressure-sensitive sensor 110 and the finger 50. That is, in the case where the finger 50 approaches from the input operation surface side, capacitive coupling between the pressure-sensitive sensor 110 and the finger 50 does not occur due to the existence of a ground layer between the pressure-sensitive sensor 110 and the finger 50. As a result, the capacitance of the pressure-sensitive sensor 110 does not change, and the pressure-sensitive sensor 110 can detect with high accuracy change in the capacitance due to pressing by an operation tool such as the finger 50.

Next, a case where a finger 52 shown in FIG. 3 (a) approaches the sensor device 100 from the side of the pressure-sensitive sensor 110 will be described. When a finger 52 approaches the sensor device 100 from the side of the pressure-sensitive sensor 110, capacitive coupling is about to occur between the finger 52 and the pressure-sensitive sensor 110 in the same manner as the case where the finger 50 approaches from the top side. In the sensor device 100 according to the present embodiment, there is the conductive housing 130 between the finger 52 and the pressure-sensitive sensor 110, and the conductive housing 130 is connected to the ground, as described above. Consequently, the conductive housing 130 prevents occurrence of capacitive coupling between the pressure-sensitive sensor 110 and the finger 52.

As a result, the pressure-sensitive sensor 110 can detect with high accuracy change in the capacitance due to pressing by an operation tool such as the finger 52.

Moreover, as shown in FIG. 3 (a), in the case where the sensor device 100 is placed on the metal table 60, and the thickness of the sensor device 100 in the Z direction is small, and the distance between the pressure-sensitive sensor 110 and the metal table 60 is small, capacitive coupling occurs between the metal table 60 and the pressure-sensitive sensor 110. Moreover, even in the case where the sensor device 100 is not placed on the metal table 60, when a finger (not shown) contacts the sensor device 100 from the bottom side of the pressure-sensitive sensor 110, capacitive coupling may occur between the finger and the pressure-sensitive sensor 110. In the sensor device 100 according to the present embodiment, there is the projection 132 of the conductive housing 130 between the metal table 60 or the finger and the pressure-sensitive sensor 110, and the conductive housing 130 is connected to the ground. Consequently, the projection 132 prevents occurrence of capacitive coupling between the pressure-sensitive sensor 110 and the metal table 60 or the finger. As a result, the pressure-sensitive sensor 110 can detect change in the capacitance with high accuracy. According to such sensor device 100, control of input operation according to pressing by the fingers 50 and 52 performed by the sensor device 100 can be realized by providing the conductive housing 130 and the conductive evaporated film 140. Moreover, in the sensor device 100, provision of the projection 132 prevents occurrence of capacitive coupling between the pressure-sensitive sensor 110 and the metal table 60 or the finger, so that thinning of the device can be realized without worrying about the capacitive coupling.

As described above, in the case where a finger approaches from the top side, the lateral side or the bottom side of the sensor device 100, the sensor device 100 can prevent occurrence of capacitive coupling between the finger and the pressure-sensitive sensor 110. Furthermore, in the configuration of the device shown in FIG. 3, it never happens that a finger or the like approaches the inside of the sensor device 100, but approach to the inside is possible depending on a configuration of the sensor device 100. In this case, a metal surface connected a ground in the same manner is placed around the inner surface of a pressure-sensitive sensor 110, and thereby false detection of a pressure value can be prevented.

In the case of holding a mobile phone 1000 with a hand as shown in FIG. 1, screen operation is performed with a fingertip on A part, so that when the fingertip is away from the panel surface, the pressure value is desirable to be zero. However, for example, in the case where a barrier is not provided on the sides of a touch panel 12 as shown in FIG. 8, the hand contacts the side of a top plate 150 in FIG. 1 on B part, which affects the sensor value of a pressure-sensitive sensor 110. On the other hand, in the present embodiment, the heights of the distal portions of the conductive housing 130 are set only dt (>0) higher than the top surface of the top plate as shown in FIG. 3 (c), and thereby, in the operation as shown in FIG. 1, occurrence of capacitive coupling between the hand on B part and the pressure-sensitive sensor 110 can be prevented by the conductive housing 130. In particular, as shown in the enlarged view of FIG. 3 (c), because of the existence of the difference in level dt described above, the conductive housing 130 functions as a barrier to make the finger 52 physically difficult to approach the pressure-sensitive sensor 110, which thus can prevent false detection of a pressure value.

As described above, according to the sensor device 100 according to the present embodiment, change in the capacitance of the pressure-sensitive sensor 110 due to the approach by an operation tool such as a finger can be prevented by the conductive housing 130 and the conductive evaporated film 140.

Figure 4:
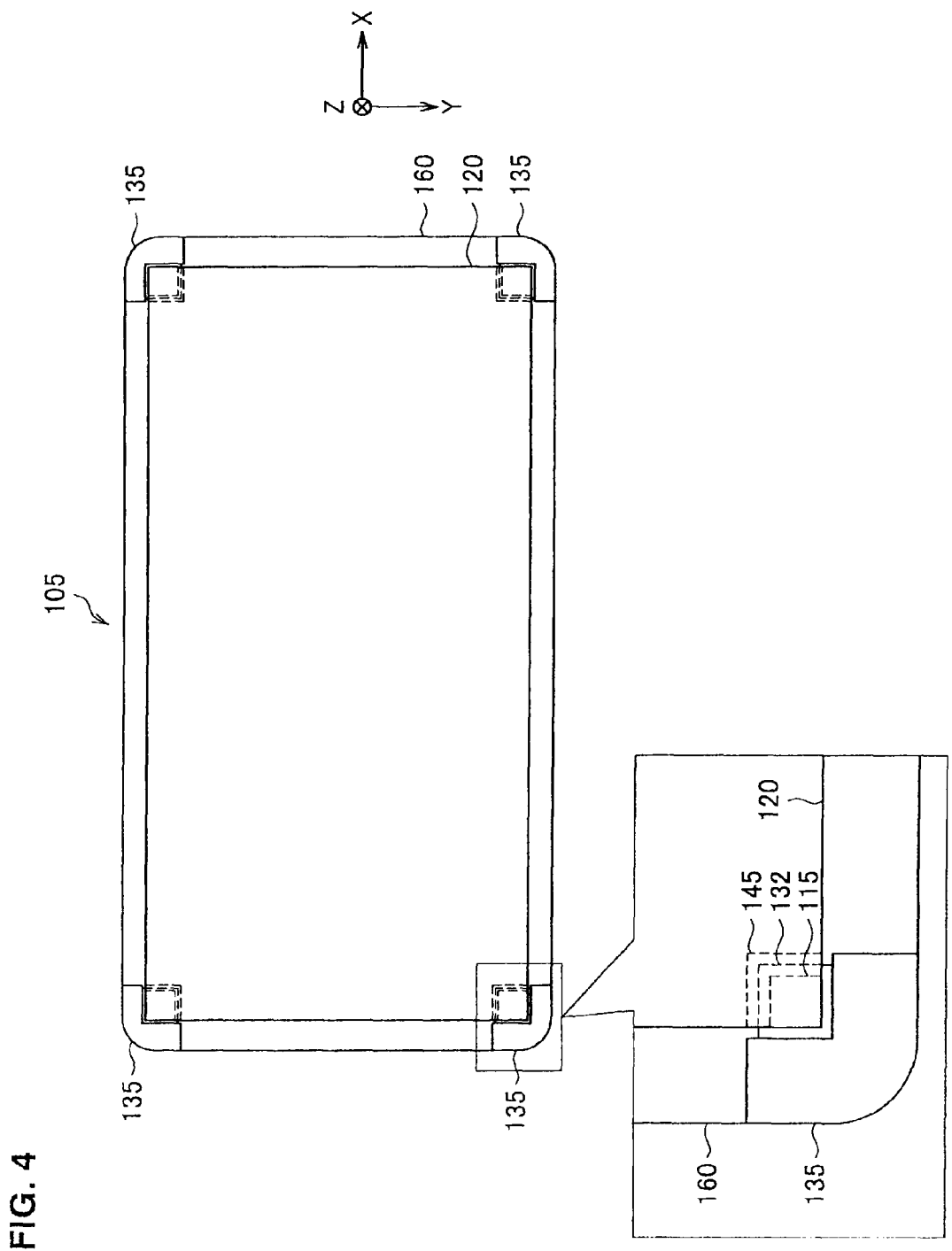
FIG. 4 are a sectional view and a plan view for explaining a sensor device according to a variation of the embodiment.

Next, a sensor device 105 according to a variation of the first embodiment of the present invention will be described in detail with reference to FIG. 4. FIG. 4 is a plan view of the surface of the sensor device 105 seen from the positive Z-axis direction. As shown in FIG. 4, the sensor device 105 includes a base member 160, pressure-sensitive sensors 115, a touch panel 120, a top plate 150, conductive housings 135, and conductive evaporated films 145. Moreover, each of the pressure-sensitive sensors 115 includes two electrodes and an elastic body.

As shown in FIG. 4, the base member 160, the touch panel 120, and the top plate 150 have substantially the same configurations as those of the base member 160, the touch panel 120, and the top plate 150 according to the first embodiment. Therefore, in the variation of the first embodiment of the present invention, among the components of the sensor device 105, the pressure-sensitive sensors 115, the conductive housings 135, and the conductive evaporated films 145 will be mainly described and description of the same components as those in the first embodiment described above is omitted.

Each of the pressure-sensitive sensors 115 has a substantially parallelepiped shape. The pressure-sensitive sensors 115 are formed at the four corners of the XY plane of the sensor device 105. According to a pressing position of a finger, the ratio of the pressure exerted on each of the four pressure-sensitive sensors 115 differs.

Each of the conductive housings 135 is formed to cover the sides in the X-axis direction and the Y-axis direction of one of the pressure-sensitive sensors 115 at the four corners, as shown in FIG. 4. Although in the example shown in FIG. 4, the conductive housing 135 is formed to cover the two side surfaces of the pressure-sensitive sensor 115, the conductive housing 135 may be formed to cover three sides or four sides of the pressure-sensitive sensor 115. Moreover, the conductive housing 135 may be formed to cover the bottom surface of the pressure-sensitive sensor 115. As the number of sides of the pressure-sensitive sensor 115 covered by the conductive housing 135 grows, the effect for preventing occurrence of capacitive coupling between a finger and the pressure-sensitive sensor 115 can be more easily obtained, which, however can be appropriately adjusted by considering a balance with manufacturing costs, the weight of the device or the like. In this manner, the form of the conductive housing 135 differs from that of the conductive housing 130, but the point of preventing occurrence of capacitive coupling between a finger and the pressure-sensitive sensor 115 and the other aspects of the configuration are substantially the same as those of the conductive housing 130, so that the description thereof is omitted.

Each of the conductive housings 145 is formed to cover the top surface of one of the pressure-sensitive sensors 115 at the four corners. In this manner, the form of the conductive evaporated film 145 differs from that of the conductive evaporated film 140, but the point of preventing occurrence of capacitive coupling between a finger and the pressure-sensitive sensor 115 and the other aspects of the configuration are substantially the same as those of the conductive evaporated film 140, so that the description thereof is omitted.

<4. Second embodiment>

Figure 5:
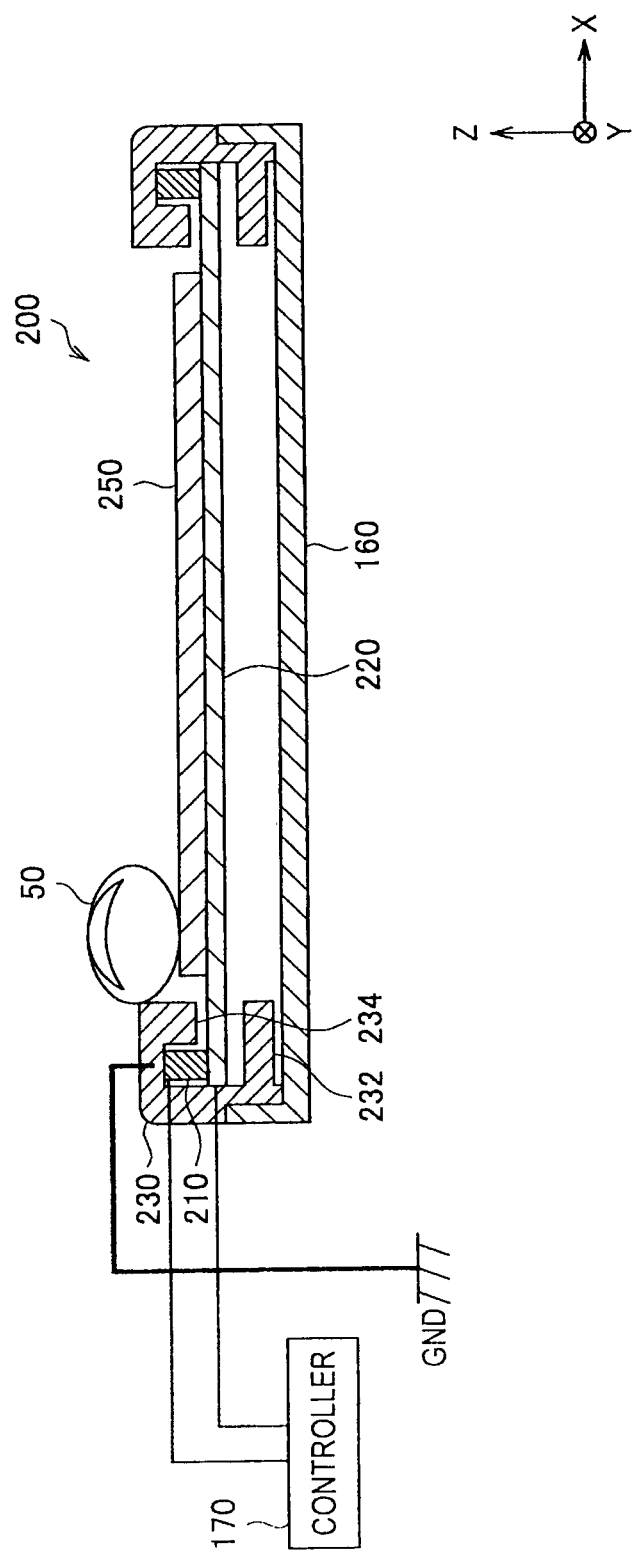
FIG. 5 is a sectional view for explaining a sensor device according to a second embodiment of the present invention.

Subsequently, a sensor device 200 according to a second embodiment of the present invention will be described with reference to FIG. 5. FIG. 5 is a sectional view of the sensor device 200. The sensor device 200 includes a base member 160, a pressure-sensitive sensor 210, a touch panel 220, a top plate 250, and a conductive housing 230. Moreover, the pressure-sensitive sensor 210 includes two electrodes and an elastic body.

As shown in FIG. 5, the base member 160 and a controller 170 have substantially the same configurations as those of the base member 160 and the controller 170 according to the first embodiment. Moreover, also regarding the top plate 250, the top plate 250 is formed smaller than the touch panel 220 in the XZ direction due to the structures of the conductive housing 230 and the pressure-sensitive sensor 210, but the other aspects of the configuration are substantially the same as those of the top plate 150 according to the first embodiment. Therefore in the second embodiment of the present invention, among the components of the sensor device 200, the conductive housing 230, the pressure-sensitive sensor 210, and the touch panel 220 will be mainly described and description of the same components as those in the first embodiment described above is omitted.

The conductive housing 230 is formed of a conductive material and an example of a barrier. The conductive housing 230 is formed on the base member 160 to cover the outer peripheral surface of the pressure-sensitive sensor 210 formed in a frame shape. Furthermore, the conductive housing 230 is formed to cover the top of the pressure-sensitive sensor 210 in the positive X-axis direction. Moreover, a projection 234 is formed on the conductive housing 230 so as to also cover the inner peripheral surface of the pressure-sensitive sensor 210 formed in a frame shape. Moreover, a projection 232 is formed between the base member 160 and the touch panel 220 and on the conductive housing 230. In this manner, in the case where the pressure-sensitive sensor 210 is formed in a frame shape, the conductive housing 230 is also formed in a frame shape so as to cover the entire pressure-sensitive sensor 210. Moreover, in the case where pressure-sensitive sensors 210 are formed only at the four corners of the sensor device 200, conductive housings 230 may formed only at the four corners. The material of the conductive housing 230 may be the same as that of the conductive housing 130 according to the first embodiment. The conductive housing 230 prevents occurrence of capacitive coupling between a finger approaching the sensor device 200 and the pressure-sensitive sensor 210.

The pressure-sensitive sensor 210 is formed immediately above the touch panel 220. The pressure-sensitive sensor 210 is formed in a frame shape in the same manner as the pressure-sensitive sensor 110 according to the first embodiment. In the pressure-sensitive sensor 210, the elastic body changes shape (stretches) by pressure exerted on the top plate 250 (the touch panel 220) due to pressing by a finger 50. The distance between the two electrodes is changed by the elastic body of the pressure-sensitive sensor 210 changing its shape (stretching), and thereby the capacitance between the electrodes of the pressure-sensitive sensor 210 changes. The capacitance of the pressure-sensitive sensor 210 is transmitted to the controller 170. Moreover, examples of the elastic body of the pressure-sensitive sensor 210 include substantially the same elastic bodies as those of the pressure-sensitive sensor 110 according to the first embodiment.

The touch panel 220 is formed between the pressure-sensitive sensor 210 and the projection 234 of the conductive housing 230. As described above, the configuration of touch panel 220 is the same as that of the touch panel 120 according to the first embodiment, except that the elastic body of the pressure-sensitive sensor 210 changes shape (stretches) by the finger 50 pressing the touch panel 220, so that the description thereof is omitted. Moreover, in the z direction, a display panel (not shown) is formed between the touch panel 120 and the base member 160.

In the sensor device 200, pressure is exerted on the pressure-sensitive sensor 210 by an operation tool such as the finger 50 pressing the touch panel 220 in the negative z-axis direction via the top plate 250. Then, the elastic body of the pressure-sensitive sensor 210 stretches, and the distance between the two electrodes of the pressure-sensitive sensor 210 changes, and thereby the capacitance of the pressure-sensitive sensor 210 changes. By using the change in the capacitance detected by the sensor device 200, the controller 170 calculates the pressure of the operation tool.

Moreover, in the sensor device 200, in the same manner as the sensor device 100 according to the first embodiment, capacitive coupling is about to occur between the pressure-sensitive sensor 210 and the finger 50 when the finger 50 approaches the sensor device 200. In the sensor device 200 according to the present embodiment, the conductive housing 230 is on the top side, the outer peripheral surface side, the inner peripheral surface side, and the bottom side of the pressure-sensitive sensor 210 and is connected to a ground. Consequently, the conductive housing 230 prevents occurrence of capacitive coupling between the pressure-sensitive sensor 210 and the finger 50. That is, in the case where the finger 50 approaches from the top side, the outer peripheral surface side, the inner peripheral surface side, or the bottom side of the pressure-sensitive sensor 210, capacitive coupling does not occur between the pressure-sensitive sensor 210 and the finger 50 due to the existence of a ground layer between the pressure-sensitive sensor 210 and the finger 50. As a result, the pressure-sensitive sensor 210 can detect change in the capacitance due to pressing by the finger 50 with high accuracy, without changing the capacitance of the pressure-sensitive sensor 210.

In the sensor device according to the second embodiment, a conductive evaporated film is not always necessary for the conductive housing 230 to be on the top side, the outer peripheral surface side, the inner peripheral surface side, and the bottom side of the pressure-sensitive sensor 210. However, the sensor device 200 may include a conductive evaporated film to more reliably prevent occurrence of capacitive coupling between a finger and the pressure-sensitive sensor 210. For example, a conductive evaporated film may be formed between the pressure-sensitive sensor 210 and the conductive housing 230 or between the pressure-sensitive sensor 210 and the touch panel 220. In this manner, in the case of not including a conductive evaporated film, the sensor device 200 can be manufactured at low const and easily.

<5. Third embodiment>

Figure 6:
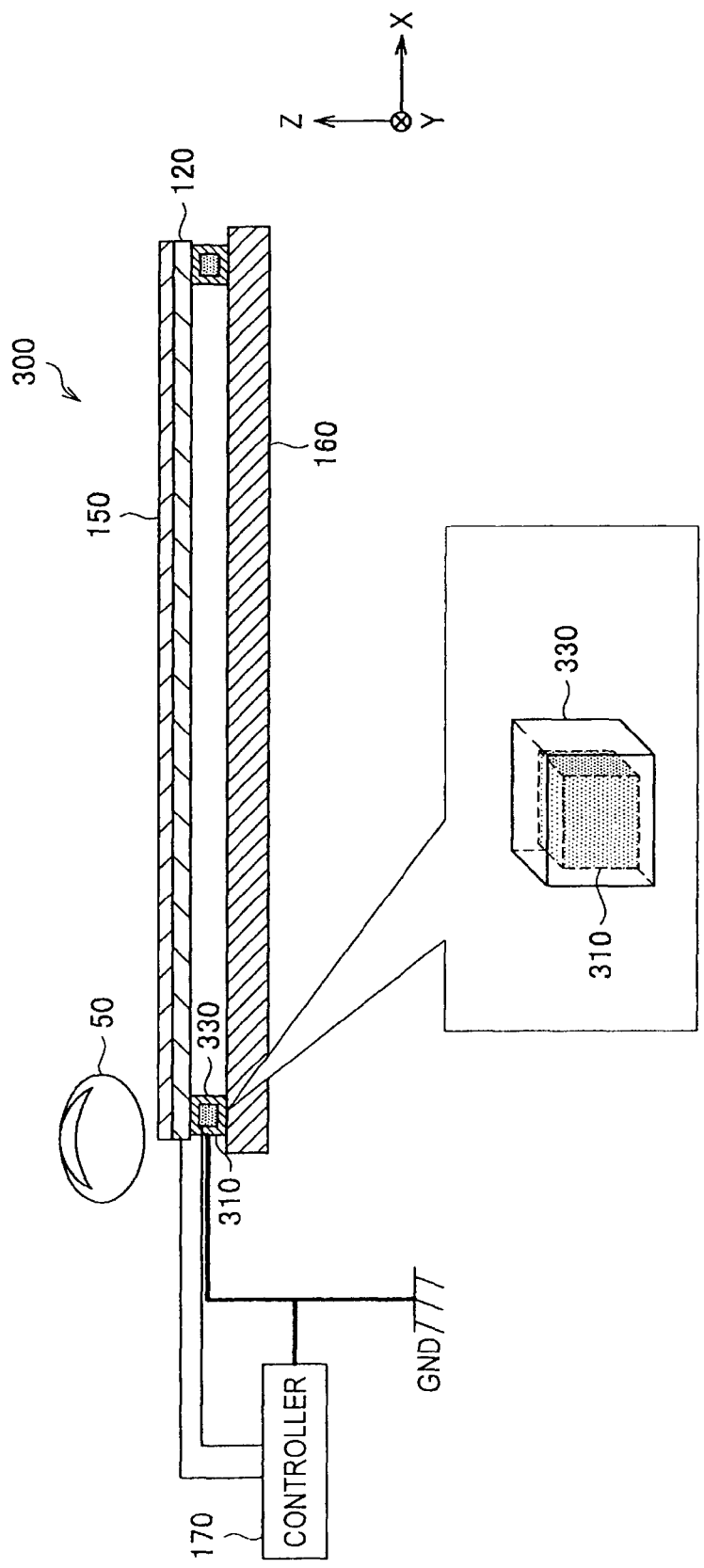
FIG. 6 is a sectional view for explaining a sensor device according to a third embodiment of the present invention.

Subsequently, a sensor device 300 according to a third embodiment of the present invention will be described with reference to FIG. 6. FIG. 6 is a sectional view for explaining the sensor device 300. The sensor device 300 includes a base member 360, pressure-sensitive sensors 310, a touch panel 120, a top plate 150, and conductive rubbers 330. Moreover, the pressure-sensitive sensor 310 includes two electrodes 312 and an elastic body 314.

As shown in FIG. 6, configurations of the touch panel 120 and the top plate 150 are the same as those of the touch panel 120 and the top plate 150 according to the first embodiment. Moreover, also regarding the base member 360, although the form of the base member 360 is different from that of the base member 160 according to the first embodiment due to the relationship with other components, the other aspects of the configuration are substantially the same. Therefore, in the third embodiment of the present invention, among the components of the sensor device 300, the pressure-sensitive sensors 310 and the conductive rubbers 330 will be mainly described and description of the same components as those in the first embodiment described above is omitted.

The conductive rubber 330 is an example of a barrier. The conductive rubber 330 is formed to cover at least a part of the pressure-sensitive sensors 310 which has a substantially parallelepiped shape. The pressure-sensitive sensor 310 and the conductive rubber 330 are formed in a parallelepiped shape as a whole. As shown in FIG. 6, the conductive rubber 330 is expected to cover the entire pressure-sensitive sensors 310. The pressure-sensitive sensors 310 and the conductive rubbers 330 are formed at the four corners of the base member 360 having a rectangular shape. The conductive rubber 330 changes shape (contracts) integrally with the elastic body 314 of the pressure-sensitive sensors 310 in response to pressing by a finger 50. Moreover, as a barrier that replaces the conductive rubbers 330 described above, there may be used a conductive carbon that changes shape (contracts) with the elastic body 314 of the pressure-sensitive sensors 310 in response to pressing, for example.

The pressure-sensitive sensors 310 may be formed in a substantially parallelepiped shape as shown in the enlarged view of FIG. 6 but may be formed in a frame shape on the base member 360. In this case, the conductive rubber 330 is formed in a cylindrical shape so as to cover the entire pressure-sensitive sensors 310.

In the sensor device 300, pressure is exerted on the pressure-sensitive sensor 310 by the finger 50 pressing the touch panel 120 in the negative z-axis direction via the top plate 150. Then, the elastic body 314 changes shape integrally with the conductive rubber 330, and the distance between the two electrodes 312 changes, and thereby the capacitance between the electrodes of the pressure-sensitive sensor 310 changes. By using the change in the capacitance detected by the sensor device 300, a controller 170 calculates the pressure of the operation tool.

Moreover, in the sensor device 300, in the same manner as the sensor device 100 according to the first embodiment, the conductive rubber 330 prevents occurrence of capacitive coupling between the pressure-sensitive sensor 310 and the finger 50 against the approach of the finger 50 from the top side, the outer peripheral surface side, the inner peripheral surface side, or the bottom side of the pressure-sensitive sensor 310. As a result, the pressure-sensitive sensor 310 can detect change in the capacitance due to pressing by the finger 50 with high accuracy, without changing the capacitance of the pressure-sensitive sensor 310.

Figure 7:
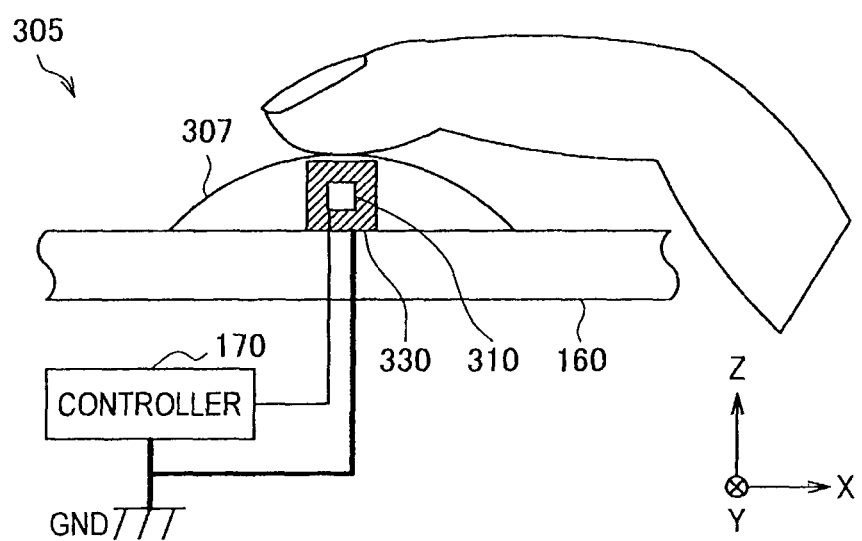
FIG. 7 is a sectional view for explaining a sensor device according to a variation of the embodiment.

Next, a sensor device 305 according to a variation of the third embodiment of the present invention will be described in detail with reference to FIG. 7. FIG. 7 is a sectional view for explaining the sensor device 305. The sensor device 305 includes a base member 160, a pressure-sensitive sensor 310, and a conductive rubber 330.

As shown in FIG. 7, the base member 160, the pressure-sensitive sensor 310, the conductive rubber 330, and the controller 170 are substantially the same as the base member 160, the pressure-sensitive sensor 310, the conductive rubber 330, and the controller 170 according to the third embodiment. Consequently, in the variation of the first embodiment of the present invention, among the components of the sensor device 305, a button 307 will be mainly described and description of the same components as those in the third embodiment described above is omitted.

The button 307 is positioned on the base member 160 and is formed to cover the pressure-sensitive sensor 310 and the conductive rubber 330. As shown in FIG. 7, the button 307 is formed in a curved shape, for example. By a finger 50 pressing the button 307, the pressure-sensitive sensor 310 and the conductive rubber 330 contract and the distance between two electrodes 312 changes, thereby the capacitance of the pressure-sensitive sensor 315 changes.

According to the sensor device 305, it is possible to separate only the pressure-sensitive sensor 310 and the conductive rubber 330 from the sensor device 300 and to use the pressure-sensitive sensor 310 and the conductive rubber 330 for another device which does not need a touch panel 120.

Moreover, according to the sensor device 305 as well, when the finger 50 or the like approaches, occurrence of capacitance between the pressure-sensitive sensor 310 and the finger 50 can be prevented in the same manner as the sensor device 300 according to the third embodiment.

The sensor device 305 is provided to a mobile phone 1000, for example. In this case, a user presses the button 307 with the finger 50 or the like and thereby can perform predetermined operation.

According to each of the embodiments described above, in the case where a part of a hand of a user approaches around the pressure-sensitive sensor 110 when operating the mobile phone 1000 provided with the touch panel including the pressure sensor as shown in FIG. 1, it is possible to operate the mobile phone 1000 without output of a false pressure value due to change in a capacitance value, for example. Moreover, by the top of the conductive housing set higher than the touch panel 120, it is possible in the operation as shown in FIG. 1 to prevent that a part other than the fingertip for operating the touch panel contacts the touch panel 120 and the pressure is detected. Furthermore, even in the situation of operating the mobile phone 1000 by putting it on the metal table, it is possible to prevent change in the capacitance value due to the approach of the metal table to the bottom of the pressure-sensitive sensor 110 and output of a false pressure value caused thereby.

Although the preferred embodiments of the present invention have been described in the foregoing with reference to the drawings, the present invention is not limited thereto. It should be understood by those skilled in the art that various modifications, combinations, sub-combinations and alterations may occur depending on design requirements and other factors insofar as they are within the scope of the appended claims or the equivalents thereof.

The present application contains subject matter related to that disclosed in Japanese Priority Patent Application JP 2009-206464 filed in the Japan Patent Office on Sep. 7, 2009, the entire content of which is hereby incorporated by reference.

What is claimed is:

1. A sensor device comprising:
   a pressure-sensitive sensor including an elastic body aligned with and sandwiched between two electrodes and configured to change shape in response to pressing of an operation tool so as to detect change in capacitance due to the change in shape; and
   a barrier which covers an entire periphery of the pressure-sensitive sensor and which prevents change in capacitance of the pressure-sensitive sensor due to capacitive coupling that occurs with approach between the pressure-sensitive sensor and the operation tool when the operation tool approaches to the pressure-sensitive sensor from respective directions normal to sides of the pressure-sensitive sensor,
   wherein the change in capacitance detected by the pressure-sensitive sensor is caused by a change in a distance between the two electrodes due to the pressing of the operation tool, and
   wherein the two electrodes and the elastic body of the pressure-sensitive sensor each have substantially same sizes in both a length direction and a width direction, the two electrodes and the elastic body are all directly aligned in a stacked configuration in a stacking direction, and the two electrodes and the elastic body all have substantially same shapes and cross-sectional areas in respective planes taken perpendicular to the stacking direction.

2. The sensor device according to claim 1,
   wherein the barrier is an electric conductor connected to a ground, and
   wherein the electric conductor prevents the change in the capacitance of the pressure-sensitive sensor due to the capacitive coupling between the operation tool and the pressure-sensitive sensor.

3. The sensor device according to claim 2,
   wherein the pressure-sensitive sensor includes a first elastic body, and
   wherein the barrier includes a second elastic body which changes form with the first elastic body while being integrated with the first elastic body, according to the pressing of the operation tool.

4. The sensor device according to claim 1, further comprising:
   a touch panel which includes an input operation surface and which detects a pressing position of the operation tool on the input operation surface,
   wherein the pressure-sensitive sensor changes form according to the pressing position on the input operation surface of the touch panel, and
   wherein the pressure-sensitive sensor detects the change in the capacitance due to the change in shape while preventing false detection of the pressure-sensitive sensor due to the operation tool near the pressure-sensitive sensor by using the barrier.

5. The sensor device according to claim 4,
   wherein the barrier covers the pressure-sensitive sensor from the input operation surface side and from a surface side perpendicular to the input operation surface.

6. The sensor device according to claim 5,
   wherein the barrier includes a first barrier which covers the pressure sensitive sensor from the input operation surface side and a second barrier which covers the pressure-sensitive sensor from the surface side perpendicular to the input operation surface,
   wherein the first barrier and the second barrier are physically separated, and
   wherein the first barrier is movable according to the change in form.

7. The sensor device according to claim 6,
   wherein the first barrier is a thin film.

8. The sensor device according to claim 6,
   wherein the second barrier covers, among surfaces of the pressure-sensitive sensor, a surface on the opposite side of the touch panel side.

9. The sensor device according to claim 6,
   wherein the second barrier is formed with a distal end higher than a position of the input operation surface.

10. The sensor device according to claim 1,
    wherein the pressing of the operation tool changes the shape of the elastic body sandwiched between the two electrodes in a contracting manner.

11. The sensor device according to claim 1,
wherein the pressing of the operation tool changes the shape of the elastic body sandwiched between the two electrodes in a stretching manner.

12. The sensor device according to claim 1,
wherein the pressure-sensitive sensor is formed as a substantially rectangular frame.

13. The sensor device according to claim 1, further comprising:
a plurality of pressure-sensitive sensors each including a respective elastic body aligned with and sandwiched between two respective electrodes,
wherein each one of the pressure-sensitive sensors is configured to change shape in response to pressing of the operation tool so as to detect change in capacitance due to the change in shape.

14. The sensor device according to claim 1,
wherein the elastic body is aligned with and sandwiched between only two electrodes.

15. The sensor device according to claim 1,
wherein the barrier covers a first side of the pressure-sensitive sensor and also covers a second side of the pressure-sensitive sensor, and
wherein the first side and the second side are normal and adjacent to each other.

16. The sensor device according to claim 1,
wherein the barrier covers at least three sides of the pressure-sensitive sensor.

17. The sensor device according to claim 1,
wherein the barrier covers at least four sides of the pressure-sensitive sensor.

18. An information processing device comprising:
a pressure-sensitive sensor including an elastic body aligned with and sandwiched between two electrodes and configured to change shape in response to pressing of an operation tool so as to detect change in capacitance due to the change in shape;
a barrier which covers an entire periphery of the pressure-sensitive sensor and which prevents change in capacitance of the pressure-sensitive sensor due to capacitive coupling that occurs with approach between the pressure-sensitive sensor and the operation tool when the operation tool approaches to the pressure-sensitive sensor from respective directions normal to sides of the pressure-sensitive sensor; and
a controller which processes information according to operation of the operation tool based on the change in the capacitance detected by the pressure sensitive sensor,
wherein the change in capacitance detected by the pressure-sensitive sensor is caused by a change in a distance between the two electrodes due to the pressing of the operation tool, and
wherein the two electrodes and the elastic body of the pressure-sensitive sensor each have substantially same sizes in both a length direction and a width direction, the two electrodes and the elastic body are all directly aligned in a stacked configuration in a stacking direction, and the two electrodes and the elastic body all have substantially same shapes and cross-sectional areas in respective planes taken perpendicular to the stacking direction.

19. The information processing device according to claim 18,
wherein the pressing of the operation tool changes the shape of the elastic body sandwiched between the two electrodes in a contracting manner.

20. The information processing device according to claim 18,
wherein the pressing of the operation tool changes the shape of the elastic body sandwiched between the two electrodes in a stretching manner.

21. The information processing device according to claim 18,
wherein the pressure-sensitive sensor is formed as a substantially rectangular frame.

22. The information processing device according to claim 18, further comprising:
a plurality of pressure-sensitive sensors each including a respective elastic body aligned with and sandwiched between two respective electrodes,
wherein each one of the pressure-sensitive sensors is configured to change shape in response to pressing of the operation tool so as to detect change in capacitance due to the change in shape.

23. The information processing device according to claim 18,
wherein the elastic body is aligned with and sandwiched between only two electrodes.

* * * * *